United States Patent [19]
Le et al.

[11] Patent Number: 5,867,444
[45] Date of Patent: Feb. 2, 1999

[54] PROGRAMMABLE MEMORY DEVICE THAT SUPPORTS MULTIPLE OPERATIONAL MODES

[75] Inventors: Hung Q. Le; Sompong P. Olarig, both of Harris County, Tex.

[73] Assignee: Compaq Computer Corporation, Houston, Tex.

[21] Appl. No.: 937,535

[22] Filed: Sep. 25, 1997

[51] Int. Cl.$^6$ .................................................. G11C 8/00
[52] U.S. Cl. .................................. 365/230.06; 365/120
[58] Field of Search .................. 365/230.06, 230.03, 365/200, 120, 189.12

[56] References Cited

U.S. PATENT DOCUMENTS 5,267,204  11/1993  Ashmore, Jr. ............................ 365/200
5,539,696   7/1996  Patel ..................................... 365/230.03
5,737,761   4/1998  Holland et al. ......................... 711/523

*Primary Examiner*—David Nelms
*Assistant Examiner*—David Lam
*Attorney, Agent, or Firm*—Akin, Gump, Strauss, Hauer & Feld, L.L.P.

[57] ABSTRACT

A programmable memory device including a register that stores a programmable mode select bit, a data input, a control input and decode circuitry that decodes the mode select bit to determine whether the memory device operates in either a check mode or a mask mode. The control input receives at least one control bit for each data byte received by the memory device during a write operation or cycle. The function of the control bit(s) depends upon the mode select bit. In a check mode of operation, each control bit functions as a parity/check bit for a corresponding data byte, where the memory device stores the check bit with its corresponding data byte during each write cycle. In the mask mode of operation, each control bit functions as a mask bit for a corresponding data byte, where the memory device selectively stores or masks the data byte depending upon the state of the corresponding mask bit.

18 Claims, 3 Drawing Sheets

PROGRAMMABLE MEMORY DEVICE THAT SUPPORTS MULTIPLE OPERATIONAL MODES

FIELD OF THE INVENTION

The present invention relates to a programmable memory device that supports multiple operational modes, and more particularly to a programmable memory device that supports check and byte mask modes of operation.

Description of the Related Art

Today, the performance of microprocessors is increasing rapidly, which requires higher memory bandwidth. The bandwidth of the commonly used dynamic random access memory (DRAM) device is becoming insufficient to satisfy the needs of system designers. Cache memory is commonly used to fill the bandwidth gap, but its additional cost is prohibitive in cost sensitive systems, such as consumer personal computers (PCs).

New types of DRAM devices, such as Rambus Direct and SyncLink DRAMs, are being introduced to help alleviate the memory bottleneck problem. These newer devices deliver high memory bandwidth by running at very high clock speeds, such as 200 megahertz (MHz) or more. The configuration of each DRAM device depends upon system needs and the particular type of computer system being designed. System performance and memory bandwidth are important considerations for consumer desktop computer systems, whereas error detection using check/parity bits or optional correction using error checking and correcting (ECC) are desirable for commercial desktop computer systems. For server applications, ECC operations are necessary to ensure data integrity.

Several groups, such as the SyncLink consortium, are proposing two different types of DRAM devices. A first data-only part would be available for consumer desktops systems and a second part with extra bits would be available for commercial desktop and server systems. For example, an 8-bit part would be available for consumer desktop systems and a separate 9-bit part would be available for commercial desktop and server systems. Manufacturers of memory devices, however, would be required to produce, supply and support two different types of devices for a range of possible memory data widths, such as 8-bit memory subsystems, 16-bit memory subsystems, 32-bit memory subsystems, etc. Further, a system designed with data-only parts would provide no simple way to perform a partial write operation without performing an inefficient read-modify-write (RMW) operation. A RMW operation requires at least three times the number of cycles as compared to a single write operation.

It is desired to simplify the memory scheme for both memory manufacturers and vendors, OEM customers and computer system designers while meeting the specifications of several different types of computer systems.

SUMMARY OF THE INVENTION

A programmable memory device according to the present invention includes a memory that stores a programmable mode select bit to determine the mode of operation of the memory device between one of several modes. The memory device includes a data input and a control input, where the control input is provided to transfer at least one control bit for each group of data bits received by the memory during a write operation or cycle. The memory device further includes decode circuitry that decodes the mode select bit to determine whether the memory device is operating in either an "check" mode or a "mask" mode. The data group is of any size and may include any number of bits. Typical memory devices include one or more data bytes, where each byte is 8 bits for a total of 9 bits per byte including the control bit. For example, typical memory sizes including control bits are 9, 18, 36, 72, etc. The function of the control bit(s) depends upon the mode select bit. In the check mode of operation, each control bit functions as check/parity bit (referred to herein as a check bit) for a corresponding data group, where the memory device stores the check bit with its corresponding data during each write cycle. In the mask mode of operation, each control bit functions as a mask bit for its corresponding data, where the memory device selectively stores or masks the data depending upon the state of the corresponding mask bit.

In one embodiment described herein, the decode circuitry includes select logic that selects between the memory cells of the memory device or the data and control input bits during write operations. The selected data is latched via flip flops or the like for storage in the memory cells. If the memory cells are selected, then the data within the memory cells are effectively unchanged and the input data is ignored or masked. In the check mode of operation, the data and control inputs are selected and stored in the memory cells so that a check bit is stored with corresponding data bits. In the mask mode of operation, the data is selected and stored only if a corresponding mask bit indicates that the data is not to be masked. If the mask bit indicates to mask the data, then the data is ignored and not stored in the memory cells.

A memory controller is provided to program the memory device for check or mask mode and to execute write cycles to store data. The memory controller includes control logic to determine the function of the extra control bits. The control logic comprises mask logic for generating mask bits for the mask mode of operation. In the mask mode, the memory controller programs the memory device for mask mode of operation during power up, reset or during normal operation, and then generates a mask bit for each group of data bits. The mask bit determines whether to store or mask the corresponding data. In this manner, the memory controller determines which data to store and which data to mask. The mask mode is particularly advantageous for consumer desktop systems where it is desired to increase memory performance. The mask mode enables the memory controller to reduce or eliminate inefficient read-modify write operations by allowing one or more bytes to be masked per cycle.

The control logic comprises error logic for generating check bits for the check mode of operation. In the check mode, the memory controller programs the memory device for check mode of operation during power up, reset or during normal operation, and then generates a check bit for each group of data bits. The check bit may be a parity bit or may be used for error detection and/or correction. In the check mode, the memory device bypasses the masking or select logic and stores each check bit with its corresponding data. The check mode is particularly advantageous for commercial desktop or server systems where it is desired to ensure data integrity. The memory controller retrieves the stored check bit(s) when reading data from the memory device, and uses the check bit(s) in any one of several manners for ensuring data integrity.

In another embodiment, multiple programmable memory devices may be coupled to a single memory controller. In such an embodiment, a system clock and a command link are common to each programmable memory. A separate data link, data/byte mask link and read/write synchronization link are coupled between the memory controller and each programmable memory device.

The present invention solves the problem of having to manufacture multiple memory devices for different system designs by providing a single programmable memory device that may be used in several configurations. Rather than manufacturing, supplying and supporting separate 8 and 9, 16 and 18, 32 and 36, etc. bit parts, the present invention allows production and support of 9, 18, 36, etc. bit programmable memory devices regardless of system configuration using a programmable memory device to determine the function of the extra bits. Although parts with extra bits are typically more expensive, production and supply of fewer part types results an greater affordability due to economies of scale. Thus, the present invention provides a better solution for both memory manufacturers and OEM customers purchasing the memory devices for system designs.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE EMBODIMENT

Figure 1:
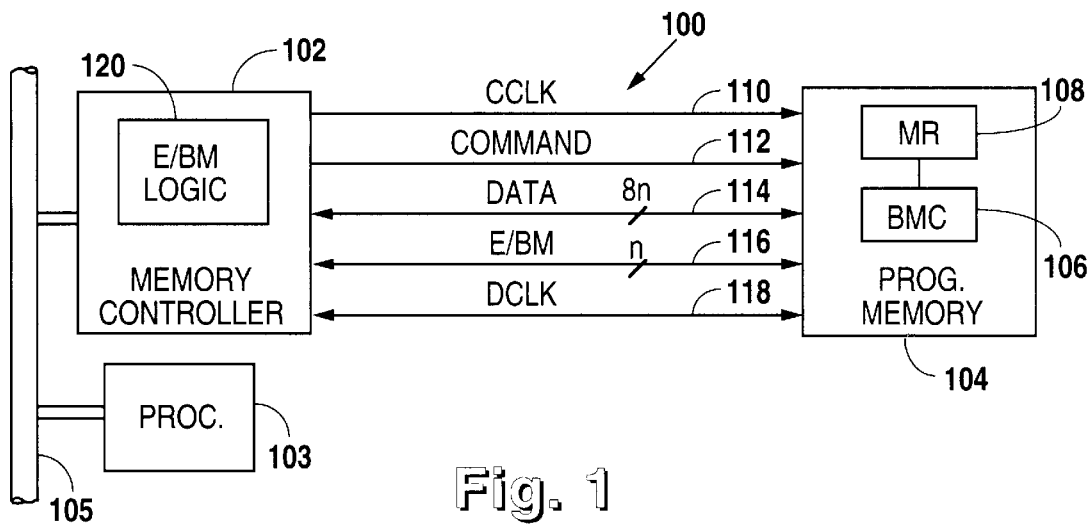
FIG. 1 is a general block diagram of an embodiment of a programmable memory system according to the present invention.

Refering to FIG. 1, a block is shown of a programmable memory system 100 implemented according to the present invention. A processor 103 and a memory controller 102 are coupled to a host bus 105. The processor 103 may be any one of several microprocessors with supporting external circuitry typically used in PCs, such as the 80386, 80486, Pentium™, Pentium II™, etc. microprocessors from Intel Corp., The memory controller 102 is further coupled to a programmable dynamic random access memory (DRAM) implemented according to the present invention. The programmable memory system 100 shown is for use in an IBM-compatible, personal computer (PC) system or the like typically used for consumer PCs or commercial workstations or server systems. The present invention is applicable, however, to any type of PC systems or any electronic system or configuration where programmable memory modes are desired. The present invention is particularly applicable to any programmable memory device configured as any multiple of eight (8) data bits (one byte) and an extra bit associated with each data byte.

The memory device 104 is in one embodiment a SLDRAM, which is a DRAM configured according to a modified version of the SyncLink standard for burst DRAM communication promulgated in the publication "Draft Standard for A High-Speed Memory Interface (SyncLink)", by the Institute of Electrical and Electronics Engineers, Inc. (IEEE) 1996. A SLDRAM typically operates in a packet oriented protocol such that it is programmable for a burst of either 4 or 8 clock cycles of data being transferred in any read or write operation cycle. Commands to the SLDRAM are accomplished with packets of four 10-bit words being sent over command link 112 from memory controller 102.

According to the present invention, the memory device 104 includes a programmable mode register 108 coupled to byte mask circuitry (BMC) 106. The memory controller 102 generally includes an error/byte mask (E/BM) logic block 120 that has a function depending upon the type of memory controller 102 and the type of memory system 100, as further described below. Data and control lines, or links, couple the memory controller 102 to the memory device 104. A CCLK link 110 provides a system clock signal from memory controller 102 to memory device 104. A command link 112 is a multi-bit unidirectional bus that carries commands, addresses and/or register write data from the memory controller 102 to the memory device 104. Command link 112 is a 10-bit link in the embodiment shown. A data link 114 is a bi-directional multi-bit data bus that includes 8n data lines, where "n" is any positive integer, such as 1, 2, 3, etc. For example, n=1 for an 8-bit memory system, n=2 for a 16-bit system, n=4 for a 32-bit system, etc. An E/BM control function link 116 includes "n" control lines that have a function based on the type of memory controller 102. The E/BM control function link 116 includes one (1) control bit for every data byte of the data link 114. A DCLK link 118 is typically two bits wide to provide signals that synchronize read and write data present on bidirectional data link 114.

The present invention is illustrated using memory systems based on "bytes" of data and multiples thereof, where each byte is 8 bits as is conventional. It is noted, however, that each "byte" may represent group or set of data of any size that comprises more or less bits than 8 bits. For example, each group of data may include only 1, 2, . . . 7 bits, or may include more than 8 bits such as 9 bits, 10 bits, 12 bits, etc. The present invention is not limited to any particular sized data group. In any event, an extra control bit is provided for each byte or group of data, and the function of the control bit is programmable by the memory controller 102 as a check bit or as a byte mask bit as described further below.

Figure 1A:
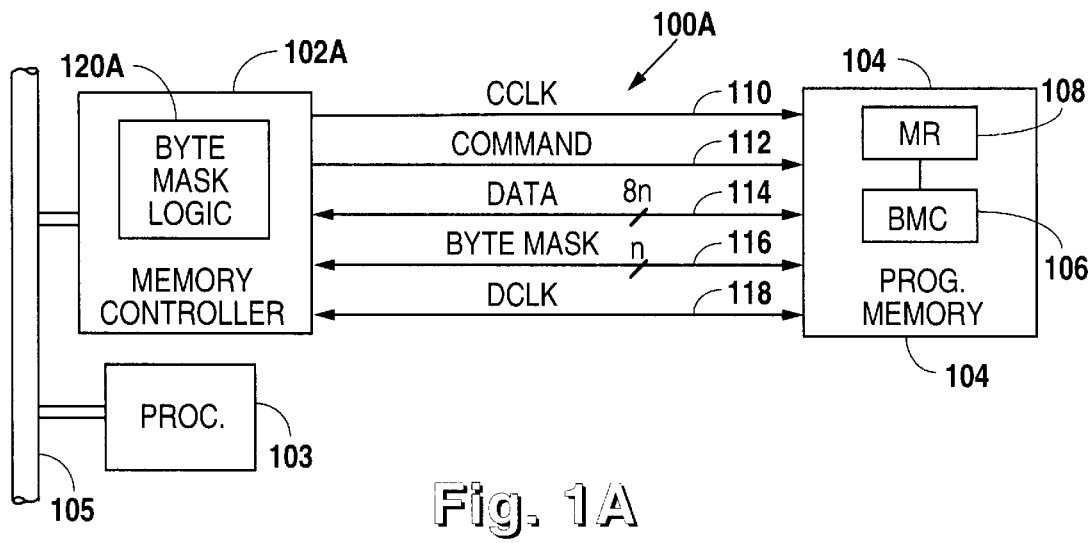
FIG. 1A is a block diagram of the programmable memory system of FIG. 1 programmed for use in systems performing byte mask operations.

The function of the E/BM logic 120 and the E/BM control function link 116 depends upon the type of memory controller 102. FIG. 1A illustrates a programmable memory system 100A in which similar components assume identical reference numerals. The memory controller 102 is configured as a memory controller 102A including byte mask logic 120A. The memory system 100A is suitable for consumer desktop computer systems or the like where system performance such as memory bandwidth is an important factor. The control function link 116 is configured as byte mask lanes, where each lane is used by the byte mask logic 120A to pass or mask a corresponding data byte of the data link 114. During power up, reset or configuration, the memory controller 102A programs the mode register 108 of the memory device 104 to enable the BMC 106 to perform byte mask operations using the bits of the byte mask lanes 116 as further described below.

Using byte mask capability, the performance of the memory system 100A is increased by enabling mask operations to occur when writing data to the memory device 104. The memory controller 102A writes data in burst cycles, and the amount of data in each burst depends upon the number of clock cycles and the width of the data bus. For n=2, two bytes are written per clock cycle, for n=4, four bytes are written per clock cycle, etc. The memory controller 102A uses the corresponding byte mask bits on the control function link 116 to determine which bytes of the data link 114 to mask. For n=2, the byte mask bits could be "00" for no masking, "01" to mask one byte, "10" to mask the other byte or "11" to mask both bytes for a given clock cycle. Byte mask operations reduce or otherwise eliminate read-modify write (RMW) operations that take more clock cycles to complete and that consume valuable processing time.

Figure 1B:
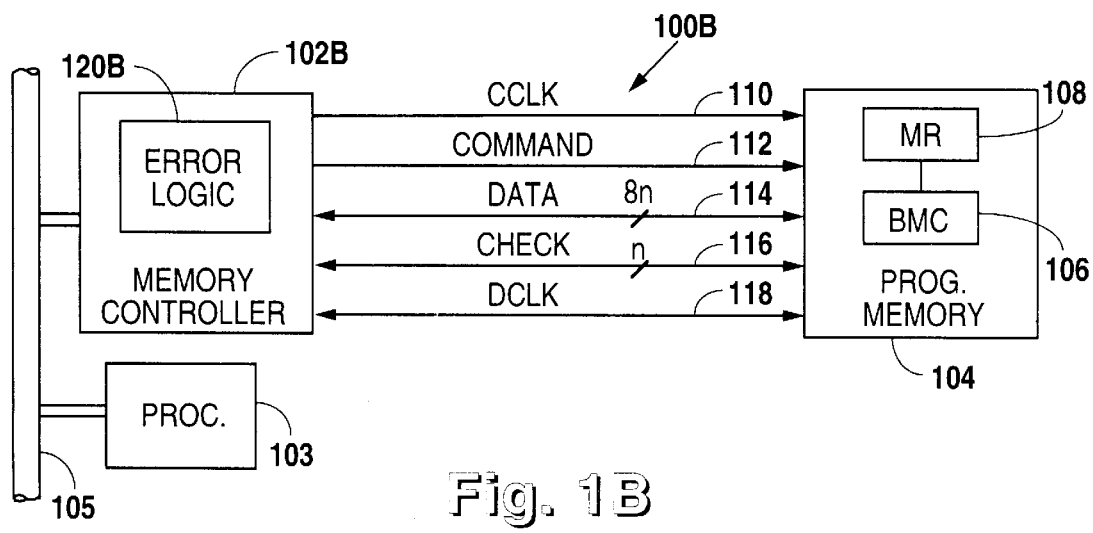
FIG. 1B is a block diagram of the programmable memory system of FIG. 1 programmed for use in systems performing a check mode for error operations.

FIG. 1B illustrates a programmable memory system l00B in which similar components assume identical reference numerals. In FIG. 1B, the memory controller 102 is configured as a memory controller 102B including error logic 120B. The memory system 100B is suitable for commercial desktop computer systems, server systems, etc. where error detection and/or correction is a more important factor. The control function link 116 is configured for check bits that are generated and used by the error logic 120B. The check bits may be used in any desired manner, such as parity bits, error bits for purposes of error detection and/or correction, etc. During power up, reset or configuration, the memory controller 102B programs the mode register 108 of the memory device 104 to disable the BMC 106 and to store the check bits along with corresponding data bytes on the data link 114. The error logic 120B of memory controller 102B generates the check bits and writes the check bits to the memory device 104 over control function link 116 with corresponding data. The stored check bits are retrieved with the corresponding data bytes during a read operation and used by the E/BM logic 120 to detect and/or correct errors in the data bytes associated therewith.

The mode register 108, in one embodiment, stores at least one mode select (MS) bit that defines the mode of operation for memory device 104. The MS bit may be programmed according to positive or negative logic, and is programmed by the memory controller 102 over the command link 112 during system initialization or reset, or anytime during operation. In this manner, the mode register 108 is programmed for either byte mask operation or for error operation in a "check" mode. The mode register 108 can be a stand-alone register within the memory device 104, or can be a portion of an existing register within memory 104, or may be any other form of bit storage device such as a flip-flop, a DRAM, an SRAM, or the like.

In other embodiments, the mode register 108 is programmed by the processor 103 executing system BIOS (basic input output system) operations or during system initialization. The mode register 108 may be programmed or re-programmed at any time by memory controller 102 or the processor 103 during operation to program memory device 104 for either check or byte mask mode. Thus, it is appreciated that the memory device 104 may be reprogrammed during operation to switch between byte mask and check modes as desired to suit the needs of a particular application program being executed. The MS bit stored in mode register 108 is decoded by memory device 104 and used to program memory 104 to perform byte mask operations or error operations.

Figure 2:
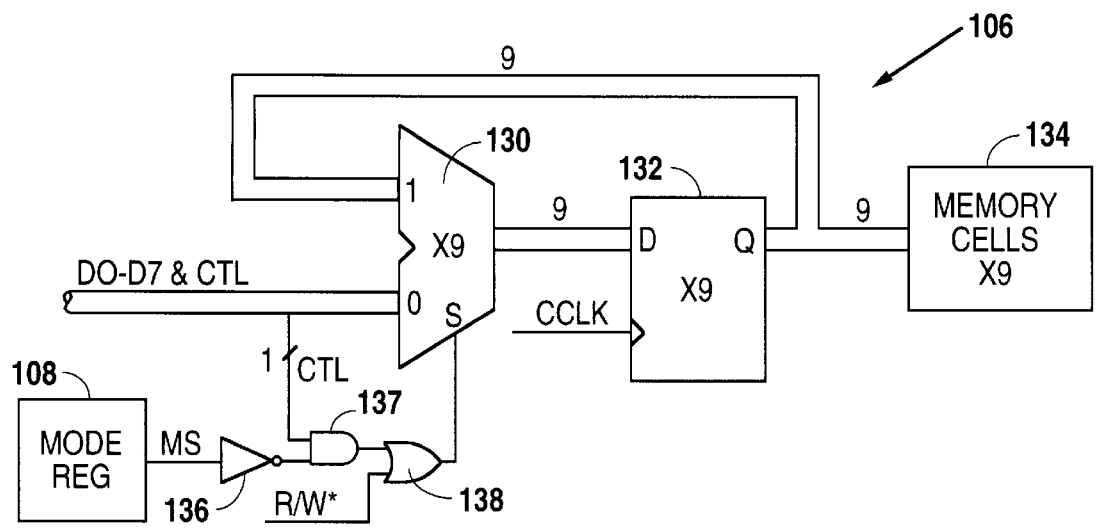
FIG. 2 is a block diagram of a 9-bit embodiment of a decode circuit used for a programmable memory device implemented according to the present invention.

Referring to FIG. 2, a block diagram is shown of a 9-bit embodiment or portion of decode circuitry of the BMC 106 according to the present invention which utilizes the MS bit of the mode register 108 to enable or disable byte mask operations within memory device 104. In this case, n=1 so that there are eight (8) data bits (D0–D8) on the data link 114 and one CTL bit on the E/BM control function link 116. Write data D0–D7 from data link 114 and the CTL bit are provided to a first set of inputs of a 9-bit, two-input multiplexor (MUX) 130. The outputs of the MUX 130 are provided on a bit by bit basis to the respective inputs of a set of 9 flip-flops (FFs) 132. The FFs 132 are shown as D-type FFs with Q outputs, but may comprise any other type of latch or flip flop known to those skilled in the art. The respective outputs of the FFs 132 are provided to the second set of inputs of the MUX 130 and are also provided to the respective inputs of a 9-bit memory cell 134 of the memory device 104. The memory cells 134 typically are configured in a row and column matrix within memory device 104. The system clock CCLK, provided by the CCLK link 110, is provided to the clock input of each of the FFs 132. The MS bit from the mode register 108 is provided to the input of an inverter 136, which has its output provided to one input of a two-input AND gate 137. The output of the AND gate 137 is provided to one input of a two-input OR gate 138, having its output provided to the select (S) input of the MUX 130. A read/write signal (R/W*) is provided to the other input of the OR gate 138.

The R/W* signal is asserted high or logic one (1) during a read cycle and low or logic zero (0) during a write cycle to the memory device 104. When the R/W* signal is logic one, the output of the OR gate 138 is asserted high to select the contents of the memory cells 134 as the inputs to the FFs 132. Thus, during read cycles, the contents of the memory cells 134 remain unchanged. During write cycles, the R/W* signal is asserted low enabling the OR gate 138 to pass the output of the AND gate 137 to the select input of the MUX 130. It is noted that the OR gate 138 is simplified logic representing operation during write cycles. The logic is simplified to provide a clear understanding.

The MS bit stored within the mode register 108 is programmed as a logic low or zero (0) for byte mask write operations. When the MS bit is logic zero, the AND gate 137 passes the CTL bit to the select input of the MUX 130 via the OR gate 138 during write cycles. If the CTL bit is low or logic zero (0) during a byte mask write operation, then the D0–D7 bits from the memory controller 102 are selected by the MUX 130, provided to the inputs of FFs 132 and latched at the Q outputs of the FFs 132 upon the next rising edge of the CCLK signal. The D0–D7 data bits are, therefore, not masked but are provided to the memory cells 134 and stored. If the CTL bit is high or logic one (1) during a byte mask write operation, then the output of the OR gate 138 is asserted high or logic one (1) during write cycles to select the memory cells 134, so that the D0–D7 bits from the memory controller 102 are masked and not written to the memory cells 134.

If the MS bit stored in mode register 108 is programmed high or logic one (1) indicating that the CTL bit is a check bit, then the AND gate 137 disables byte mask by asserting its output low. The output of the OR gate 138 is thus asserted low during write cycles, so that the D0–D7 data bits and the CTL check bit from the memory controller 102 are always selected as the inputs to the FFs 132 during write cycles. The D0–D7 data byte and the CTL bit are thus stored in the memory cells 134 during write operations when the MS bit is programmed at logic one. In this manner, a check bit generated by the memory controller 102 is stored for each data byte. The memory controller 102 performs a read operation to retrieve each data byte and its corresponding check bit, and uses the check bit for parity, error detection, error correction, etc.

Figure 3:
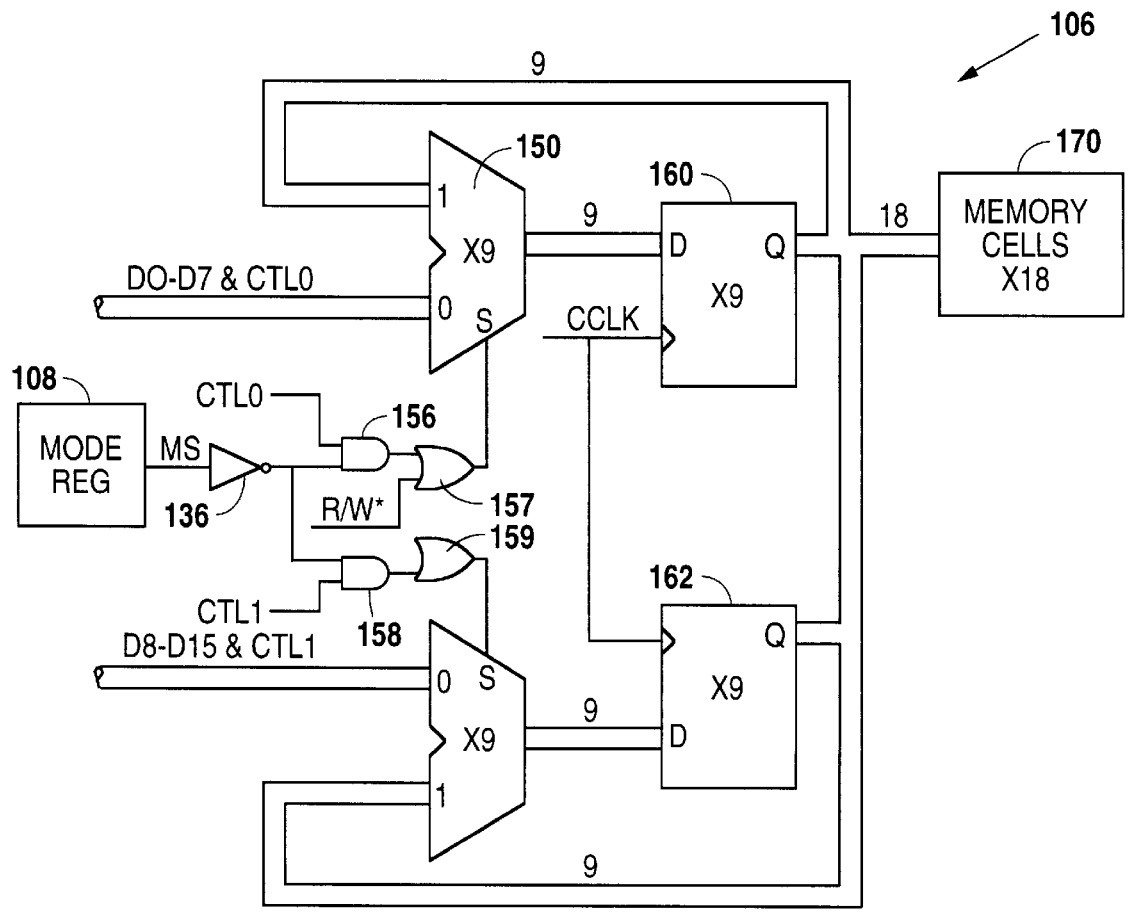
FIG. 3 is a block diagram of an 18-bit embodiment of a decode circuit used for a programmable memory device implemented according to the present invention.

Now referring to FIG. 3, a schematic block diagram illustrates an embodiment of the BMC 106 for an 18-bit (n=2) programmable memory device 104 implemented according to the present invention. In this case, there are 16 data bits D0–D15 and two CTL bits, referred to as CTL0 and CTL1. Again, the mode register 108 stores a programmable MS bit to enable or disable byte mask operations within the memory device 104. The MS bit is inverted by the inverter 136. Operation is very similar to the 9-bit embodiment shown in FIG. 2A. The lower byte of write data (D0–D7) from data link 114 and the CTL0 bit from the control function link 116 are provided to one set of inputs of a 9-bit MUX 150. The respective outputs of a set of 9 D-type FFs 160 are provided to a second set of inputs of a MUX 150 and to corresponding inputs of 18-bit memory cells 170 of the memory device 104. The outputs of the MUX 150 are provided to respective D inputs of the FFs 160. Similarly, an upper byte of write data (D8–D15) and the second CTL1 bit from the control function link 116 are provided to a first set of inputs of another 9-bit MUX 152. The respective outputs of another set of 9 D-type FFs 162 are coupled to a second set of inputs of the MUX 152 and to corresponding inputs of the memory cells 170 of memory device 104. The outputs of the MUX 152 are provided to respective inputs of the FFs 162. The CCLK signal is provided to the clock inputs of the FFs 160, 162. The output of the inverter 136 is provided to one input each of two two-input AND gates 156 and 158. The other input of AND gate 156 receives the CTL0 bit and the other input of the AND gate 158 receives the CTL1 bit. The output of the AND gate 156 is provided to one input of a two-input OR gate 157 having its output provided to the select input of the MUX 150. The output of the AND gate 158 is provided to one input of another two-input OR gate 159 having its output provided to the select input of the MUX 152. The R/W* signal is provided to the other inputs of both of the OR gates 157, 159.

Operation is similar in that the R/W* signal enables the OR gates 157, 159 during write operations. The MS bit of the mode register 108 enables the AND gates 156, 158 if the MS bit is programmed low or logic zero (0). When the MS bit is logic zero (0) for byte mask, the CTL0 bit determines whether to mask the low byte (D0–D7) and the CTL1 bit determines whether to mask the high byte (D8–D15) in a similar manner as described previously. If the MS bit is programmed high or logic one (1) for check mode, then all of the 18 data and check bits D0-D15, CTL0 and CTL1 are stored in the memory cells 170 during write operations.

FIG. 3 illustrates that operation is similar for any multiple of data bytes and at least one CTL bit per byte. For example, for n=4, the memory device 104 includes storage space for 32 bits or four data bytes and a corresponding four CTL bits for a total of 36 bits. Each CTL control bit serves either as a byte mask or a check bit for a corresponding data byte. FIG. 3 also illustrates that each of multiple data groups or bytes are selectively masked based on a corresponding control bit if the MS bit indicates byte mask mode. During each write cycle, if the MS bit is a logic zero, then based on the control bits CTL0 and CTL1, either both bytes are masked, or the lower byte D0–D7 is masked while the upper byte D8–D15 is stored in the memory cells 170 or vice versa, or neither byte is masked. Thus, during a burst cycle that includes a plurality of write cycles, the memory controller 102 has full control of which bytes are masked, if any.

Figure 4:
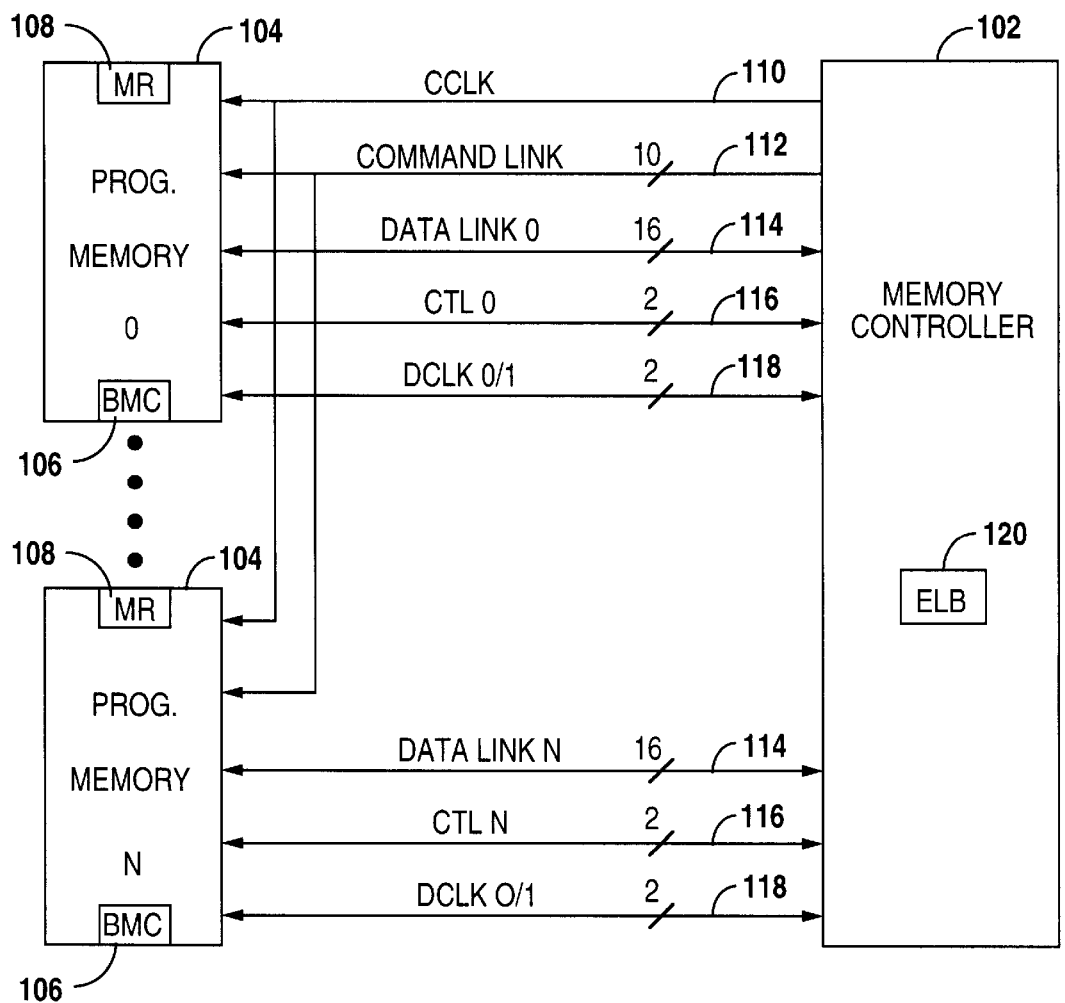
FIG. 4 is a block diagram of an embodiment of a plurality of N programmable memory devices implemented according to the present invention coupled to a single memory controller.

FIG. 4 illustrates a configuration of multiple programmable 18-bit memory devices 104, labeled "0" through "N", coupled to a single memory controller 400. The command link 112 and the system clock line 110 are common to each of the memory devices 104. A separate multi-bit data link 114, E/BM control function link 116 and DCLK link 118 are provided between the memory controller 400 and each individual memory device 104. The memory controller 102 supports communication with each of the programmable memories 104, with the programming of the mode register 108 of each memory 104 being similar to that described above for a single memory 104. Additionally, the BMC 106 of each memory 104 operates in a similar manner as the BMC 106 of the signal memory 104 configuration described above.

It can now be appreciated that a system and method according to the present invention solves the problem of manufacturing multiple memory devices for different system designs by providing a single programmable memory device that may be used in several configurations. Rather than manufacturing, supplying and supporting separate 8 and 9, 16 and 18, 32 and 36, etc. bit parts, the present invention allows production and support of 9, 18, 36, etc. bit programmable memory devices regardless of system configuration using a programmable memory to determine the function of the extra bits. Although parts with extra bits are typically more expensive, production and supply of fewer part types results an greater affordability due to economies of scale. Thus, the present invention provides a better solution for both memory manufacturers and OEM customers purchasing the memory devices for system designs.

Although a system and method according to the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

We claim:

1. A programmable memory device, comprising:
    a memory that stores a programmable mode select bit;
    a data input for receiving at least one data group at a time;
    a control input for receiving at least one control bit at a time for each of said at least one data group;
    a plurality of memory cells; and
    decode circuitry coupled to said memory, said data input, said control input and said plurality of memory cells that decodes said mode select bit and selects between storing at least one control bit with each of said at least one data group within said plurality of memory cells and storing or masking each of said at least one data group based on a corresponding control bit.

2. The programmable memory device of claim 1, wherein each data group comprises at least one byte.

3. The programmable memory device of claim 1, wherein each data group comprises n bytes and wherein said control input receives n control bits, and wherein n is a positive integer.

4. The programmable memory device of claim 1, wherein said decode circuitry includes select logic that selects between said plurality of memory cells and said data and control inputs and that provides selected data to said plurality of memory cells.

5. The programmable memory device of claim 1, wherein said decode circuitry further comprises:
    select logic that selects data from said data and control inputs for storage in said plurality of memory cells based on a select input; and
    decode logic coupled to said select logic to cause said select logic to select data from said data and control inputs for storage when said mode select bit indicates a check mode and to select said data inputs for storage based on said control bit if said mode select bit indicates a mask mode.

6. The programmable memory device of claim 1, further comprising:

said data input receiving a plurality of data groups;

said control input receiving a plurality of control bits, each corresponding to one of said plurality of data groups; and said decode circuitry causing said memory cells to store each control bit with a corresponding data group if said mode select bit indicates a check mode, and that selectively masks each data group based on a corresponding control bit if said mode select bit indicates a mask mode.

7. The programmable memory device of claim 1, wherein said decode circuitry stores said at least one control bit with said at least one data group if said mode select bit indicates a check mode but otherwise uses said at least one control bit to determine whether to store said at least one data group.

8. A programmable memory system, comprising:

a register that stores a mode select bit;

a memory device coupled to said register that operates in either one of a check mode and a mask mode of operation based on said mode select bit during write cycles, wherein said memory device stores at least one control bit with at least one data group in said check mode and selectively masks said at least one data group based on said at least one control bit in said mask mode; and a memory controller coupled to said memory device and said register that programs said mode select bit of said register to select between said check and mask modes of operation and that executes write cycles to said memory device.

9. The system of claim 8, wherein said memory device includes memory cells and select logic that selectively stores each control bit and each data group in said memory cells based on said select bit and said control bits.

10. The system of claim 8, further comprising a processor coupled to said memory controller.

11. The system of claim 8, wherein said memory controller further comprises:

control logic that programs said mode select bit for one of said check and mask modes, that generates at least one control bit for each data group and that asserts said at least one control bit on said control link.

12. The system of claim 11, wherein said control logic comprises mask logic that programs said mode select bit for mask mode, that generates at least one mask bit for each data group and that asserts said at least one mask bit on said control link.

13. The system of claim 11, wherein said control logic comprises error logic that programs said mode select bit for check mode, that generates at least one check bit for each data group and that asserts said at least one check bit on said control link.

14. The system of claim 8, further comprising:

said at least one data group comprising n data bytes and said at least one control bit comprising n control bits, wherein each control bit corresponds to one of said n data bytes and wherein n is a positive integer.

15. The system of claim 8, wherein said register is disposed within said memory device.

16. A method of programming and operating a programmable memory device in one of two modes including a check mode and a mask mode, comprising steps of:

programming a memory device to operate in either one of a check mode and a mask mode;

providing a control bit with each of at least one data byte to the memory device during write operations;

the memory device storing the control bit with each data byte during each write cycle if programmed to operate in check mode; and the memory device selectively storing or masking each data byte depending upon a state of a corresponding control bit during each write cycle if programmed to operate in byte mask mode.

17. The method of claim 16, further comprising:

said step of providing a control bit with each of at least one data byte comprising a step of providing a plurality of data bytes and a corresponding plurality of control bits; and the memory device selectively masking each of said plurality of data bytes based on corresponding control bits if programmed to operate in byte mask mode.

18. The method of claim 16, wherein said step of programming the memory device comprises programming a mode register within the memory device with a mode select bit.

* * * * *